(12) United States Patent
Huang (10) Patent No.: US 12,068,184 B2
(45) Date of Patent: Aug. 20, 2024

(54) CALIBRATION POD FOR ROBOTIC WAFER CARRIER HANDLING AND CALIBRATION PERFORMED USING SAME

(71) Applicant: Taiwan Semiconductor Manufacturing Company, Ltd., Hsinchu (TW)

(72) Inventor: Tzu-Chin Huang, Hsinchu (TW)

(73) Assignee: Taiwan Semiconductor Manufacturing Company., Ltd., Hsinchu (TW)

( * ) Notice: Subject to any disclaimer, the term of this patent is extended or adjusted under 35 U.S.C. 154(b) by 382 days.

(21) Appl. No.: 17/366,661

(22) Filed: Jul. 2, 2021

(65) Prior Publication Data

US 2022/0344185 A1 Oct. 27, 2022

Related U.S. Application Data

(60) Provisional application No. 63/178,125, filed on Apr. 22, 2021.

(51) Int. Cl.
*H01L 21/673* (2006.01)
*H01L 21/677* (2006.01)
*H01L 21/68* (2006.01)

(52) U.S. Cl.
CPC .. *H01L 21/67386* (2013.01); *H01L 21/67775* (2013.01); *H01L 21/681* (2013.01);
(Continued)

(58) Field of Classification Search
CPC ......... H01L 21/67386; H01L 21/67775; H01L 21/681; H01L 21/67379; H01L 21/67778; H01L 21/6773; H01L 21/67703; H01L 21/677; H01L 21/02098; H01L 2224/75001; H01L 2224/76001; H01L 2224/76; H01L 21/68; H01L 2223/54426; H01L 2224/02122; H01L 2224/0217; H01L 2224/10165; H01L 2224/10135; H01L 2224/75753; H01L 2224/767;
(Continued)

(56) References Cited

U.S. PATENT DOCUMENTS

| 6,323,616 B1 * | 11/2001 | Sagues | ................... B25J 9/1692 318/568.15 |
| 2005/0208842 A1 * | 9/2005 | Lin | ...................... H01R 13/648 439/894 |

(Continued)

*Primary Examiner* — Abby Y Lin
*Assistant Examiner* — Esvinder Singh
(74) *Attorney, Agent, or Firm* — Lippes Mathias LLP (57) ABSTRACT

A calibration pod for calibrating a robotic wafer pod handling apparatus includes a pod body configured for handling by the robotic pod handling apparatus, at least one laser disposed on a bottom of the pod body, and a power module disposed on or in the pod body and operatively connected to power the at least one laser. In a manufacturing method, the pod body comprises a wafer carrier for carrying a cassette of semiconductor wafers, which has a bottom with a plurality of holes for aligning placement of the wafer carrier in a load port of a semiconductor device fabrication facility. The at least one laser here includes a plurality of lasers corresponding to the plurality of holes in the bottom of the wafer carrier, and each laser is mounted in a respective hole of the bottom of the wafer carrier.

20 Claims, 9 Drawing Sheets

(52) U.S. Cl.
CPC .............. *G05B 2219/39024* (2013.01); *G05B 2219/39527* (2013.01)

(58) Field of Classification Search
CPC . H01L 2224/77753; H01L 2224/80121; H01L 2224/80122; H01L 2224/81121; H01L 2224/81122; H01L 2224/80123; H01L 2224/80129; H01L 2224/8013; G05B 2219/39024; G05B 2219/39527; G05B 2219/2602; G05B 2219/37608; G05B 2219/37049; G05B 2219/40058; G05B 2219/40082; G05B 2219/49113; G05B 2219/50033; G05B 2219/40623; B25J 9/1628; B25J 9/163; B25J 9/1653; B25J 9/1656; B25J 9/1664; B25J 9/1669; B25J 9/1679; B25J 9/1687; B25J 9/1692; B25J 11/0095; B25J 13/089; B25J 13/088; B25J 19/022

See application file for complete search history.

(56) References Cited

U.S. PATENT DOCUMENTS

| | | | |
|---|---|---|---|
| 2014/0173870 A1* | 6/2014 | Otts | B23P 19/04 29/720 |
| 2014/0308108 A1* | 10/2014 | Fosnight | H01L 21/67379 414/800 |
| 2019/0164790 A1* | 5/2019 | Liu | H01L 21/67386 |
| 2019/0164799 A1* | 5/2019 | Liu | H01L 21/67386 |
| 2019/0244845 A1* | 8/2019 | Parathithasan | H01L 21/67126 |
| 2020/0130191 A1* | 4/2020 | Inoue | B23K 26/04 |
| 2020/0219722 A1* | 7/2020 | Randhawa | H01L 21/67028 |

* cited by examiner

CALIBRATION POD FOR ROBOTIC WAFER CARRIER HANDLING AND CALIBRATION PERFORMED USING SAME

This application claims the benefit of U.S. provisional application Ser. No. 63/178,125 filed Apr. 22, 2021 and titled "WAFER POD INCLUDING AUTOMATIC CALIBRATION FIXTURE". U.S. provisional application Ser. No. 63/178,125 filed Apr. 22, 2021 and titled "WAFER POD INCLUDING AUTOMATIC CALIBRATION FIXTURE" is incorporated herein by reference in its entirety.

BACKGROUND

The following relates to wafer handling systems of types used in semiconductor device fabrication facilities, to wafer carriers (also called pods) within which semiconductor wafers are moved in such wafer handling system, to automated wafer handling methods, to calibration (e.g. alignment) of robotic mechanisms for wafer loading and/or unloading, and to related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
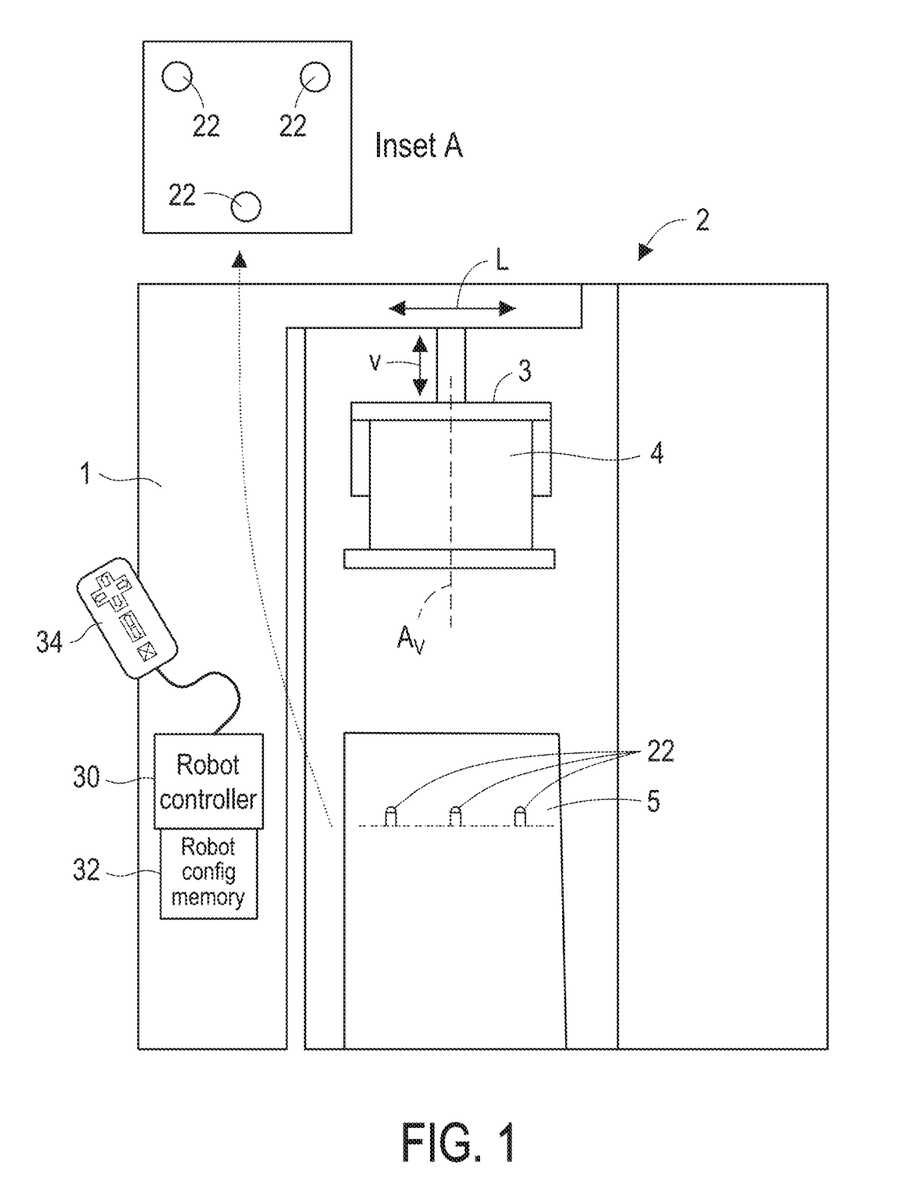
FIG. 1 diagrammatically illustrates a robotic wafer handling system or portion thereof.

With reference to FIG. 1, a nonlimiting illustrative robotic wafer handling system or portion thereof for use in a semiconductor device fabrication facility includes a transfer tool 1 for transferring semiconductor wafers to a bench tool 2. The bench tool may, for example, comprise a wet bench, an etching station, a deposition station (e.g. a vacuum evaporation deposition system or so forth), or more generally any type of bench tool used in a semiconductor device fabrication facility. The transfer tool 1 includes a robot 3 for transferring a wafer carrier or pod 4 to a load port 5 of the bench tool 2.

Figure 2:
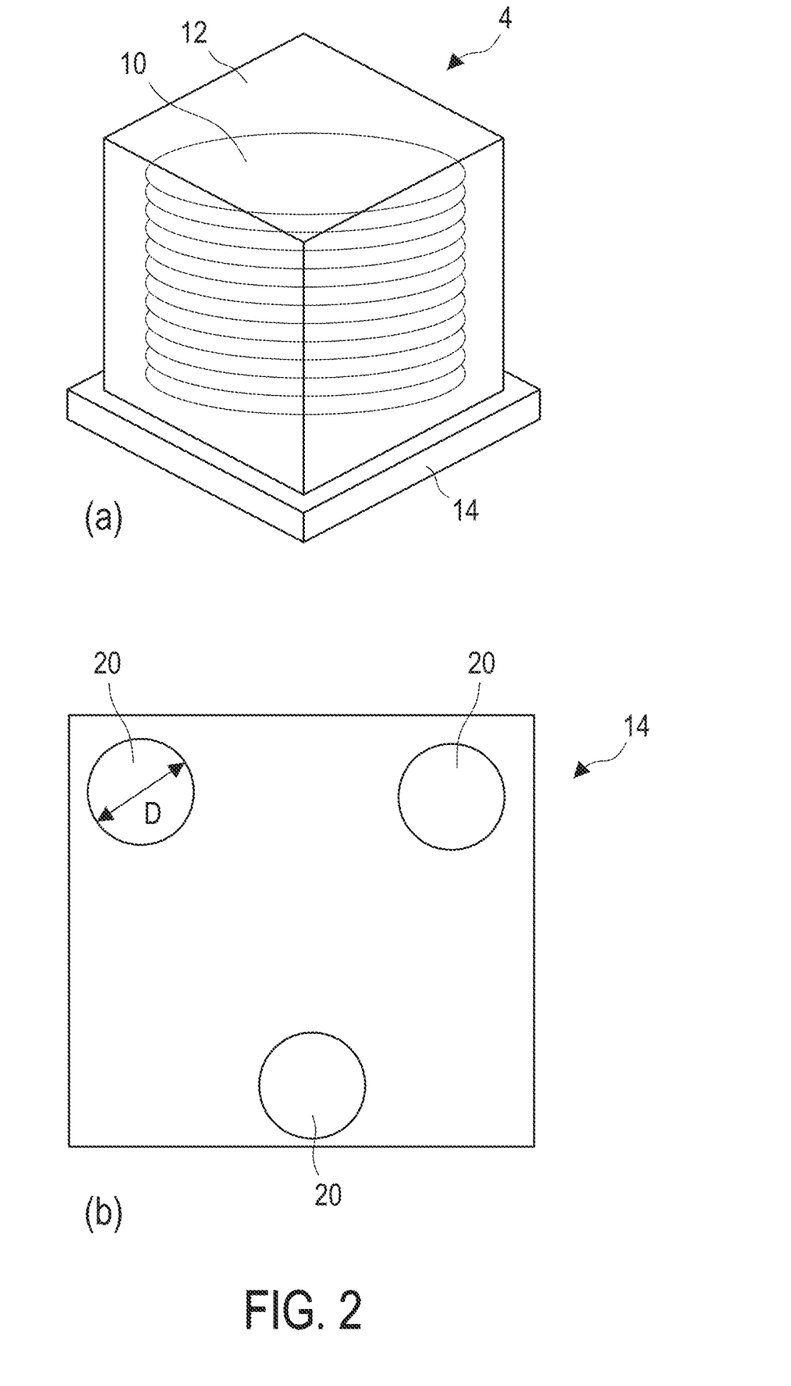
FIG. 2 diagrammatically illustrates (a) a perspective view of the wafer carrier or pod of FIG. 1, and (b) its bottom.

With continuing reference to FIG. 1 and with further reference to FIGS. 2(*a*) and 2(*b*), the wafer carrier or pod 4 is designed (e.g. sized and shaped) to receive a cassette 10 of semiconductor wafers via a suitable door in the pod body 12 (not shown in FIG. 2(*a*)). The wafer carrier or pod 4 has a pod body 12 which includes a bottom 14. The pod body 12 is sized to receive the cassette 10. Note that FIG. 2(*a*) illustrates the pod body 12 in phantom to reveal the cassette 10 disposed inside the wafer carrier 4. This may be the case (that is, the pod body 12 may comprise a transparent or translucent material such as a transparent or translucent plastic material), or alternatively the pod body 12 may be made of an opaque material such as a metal. Moreover, while the illustrative wafer carrier or pod 4 has the geometric shape of a cube or rectangular cuboid, the wafer carrier or pod may have other geometric shapes, e.g. a cylinder shape, with the shape chosen to fit into the load port 5. FIG. 2(*b*) illustrates the bottom 14 of the pod body 12 in plan view. As seen, the bottom 14 includes holes 20, namely three holes 20 in the illustrative embodiment, although the number of holes could be one, two, three, four, or more. As will be described, the holes 20 are for lateral alignment (that is, alignment in the plane of the bottom 14) of the wafer carrier or pod 4 in the load port 5; for this purpose, having at least three holes 20 can be beneficial to provide lateral alignment with respect to each of: orthogonal translation directions, e.g. x- and y-directions, and rotation of the wafer carrier or pod 4. As seen in FIG. 2(*b*), each hole has a diameter D, and the holes 20 are arranged in a lateral pattern on the bottom 14 of the pod body 12. While circular holes 20 with diameter D are shown, it is contemplated for the holes to have other cross-sections, e.g. square holes, hexagonal holes, or so forth. Moreover, while the illustrative holes 20 are through-holes, they could instead be blind holes.

With reference back to FIG. 1, the load port 5 includes alignment pins 22 which, as shown in Inset A of FIG. 1 showing a diagrammatic view into the load port 5, are arranged in the same lateral pattern as the holes 20 in the bottom 14 of the pod body 12 of the wafer carrier or pod 4, and there is an alignment pin corresponding to each hole. The alignment pins 22 are sized to fit into the holes 20. If the holes in the bottom 14 are blind holes, then a height of the alignment pins 22 is suitably less than a depth of the blind holes. Alignment pins 22 are thus configured to mate into the holes 20 of the bottom of the pod body 12 to precisely position the wafer carrier or pod 4 laterally in the load port 5, ensuring proper lateral positioning of the wafer carrier or pod 4 in the load port 5 for accessing the semiconductor wafers of the cassette 10 using wafer handling hardware of the bench tool 2 (e.g., robotic wafer handling hardware, an aperture through which wafers are manually retrieved from the cassette 10, or so forth, not shown).

Some semiconductor device fabrication facility layouts provide an overhead hoist transport (OHT) system for transporting wafer carriers between various bench tools of the facility. In this arrangement, the transfer tool 1 shown in FIG. 1 may be one portion of the overall OHT system, and the robot 3 may move laterally via the OHT between bench tools to move a cassette of semiconductors between the various bench tools which perform various processing steps of a device fabrication process. At each bench tool 2, the transfer tool 1 provides for lateral movement L of the robot 3 and carried wafer carrier or pod 4 to laterally align the wafer carrier or pod 4 with the load port 5 (or, more precisely to laterally align the holes 20 in the bottom 14 of the pod body 12 with the alignment pins 22 of the load port 5). The lateral movement L is diagrammatically indicated in FIG. 1, and may include translation of the wafer carrier or pod 4, e.g. in orthogonal x- and y-directions, and optionally also rotation of the wafer carrier or pod 4. The transfer tool 1 also provides for vertical movement V of the robot 3 and carried wafer carrier or pod 4 to lower the laterally aligned wafer carrier or pod 4 into the load port 5; and to subsequently raise the wafer carrier or pod 4 out of the load port 5 for transport via the OHT to a next bench tool of the process. Although not described or illustrated, the robot 3 may have other degrees of freedom and/or functionality, such as having a gripping mechanism that can be activated to grip and pick up the wafer carrier or pod 4 for transport to the load port 5 and that can be deactivated to release the wafer carrier or pod 4, for example once it is positioned in the load port 5.

To automate operation, the robot 3 typically includes a robot controller 30 that controls the operation of the robot, for example to perform the wafer carrier or pod pickup and release operations at appropriate times, to move the wafer carrier or pod 4 directly over the load port 5 and then lower the wafer carrier or pod 4 into the load port 5, and so forth. The robot controller 30 may, for example, comprise a microprocessor or microcontroller programmed to control the robot 3. The robot controller 30 may, for example, be integrated into the transfer tool 1. Notably, a calibration process is performed to determine the correct lateral alignment of the robot 3 with the load port 5 to precisely place the wafer carrier or pod 4 directly over the load port 5 in lateral alignment with the load port 5 (or, more precisely to align the holes 20 in the bottom 14 of the pod body 12 with the alignment pins 22 of the load port 5). The lateral alignment may be specified, for example, by coordinate values of the lateral movement L that provide this directly overhead positioning, for example, the coordinate values may include an x-coordinate value, a y-coordinate value, and optionally also a rotation angle value if the robot 3 can rotate the wafer carrier or pod 4 about its vertical axis Av indicated in FIG. 1. The lateral alignment is suitably determined by visual observation and adjustment of the lateral movement L and then stored in a robot configuration memory 32. The robot configuration memory 32 may, for example, be a CMOS memory, a FLASH memory, or the like, and optionally may be integrated with the robot controller 30, e.g. as a memory of the robot controller 30.

Figure 3:
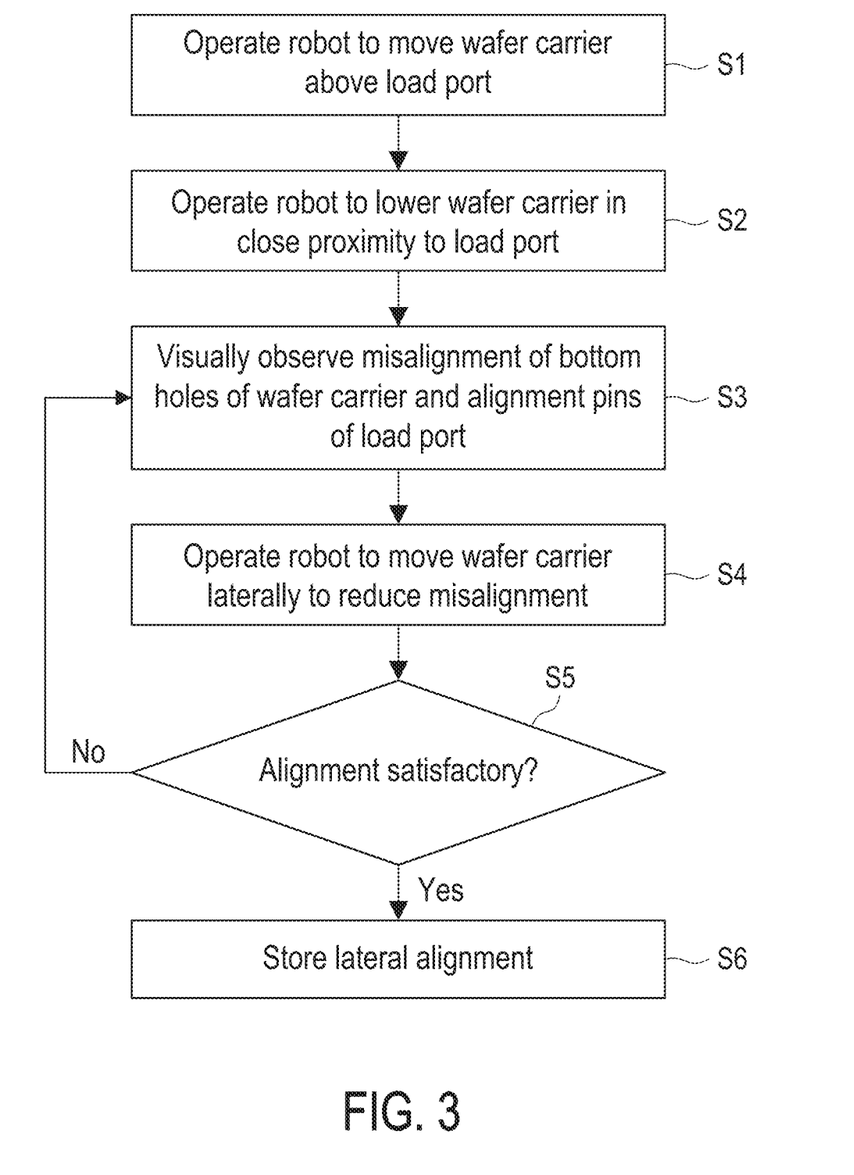
FIG. 3 shows a flowchart for calibrating the robotic wafer handling system of FIG. 1 using the wafer carrier or pod of FIGS. 1 and 2.

With continuing reference to FIGS. 1 and 2 and with further reference to FIG. 3, a method for performing a calibration to determine the lateral alignment of the robot 3 with the load port 5 is diagrammatically shown in FIG. 3. In an initial operation (not shown), the robot 3 picks up the wafer carrier or pod 4. For the calibration, this may be done with or without a loaded cassette 10. In an operation S1, the robot 3 is operated by the controller 30 to move the wafer carrier or pod 4 above the load port 5 using its lateral movement L. It will be appreciated that the lateral position of the wafer carrier or pod 4 in this operation S1 is approximate, as the lateral alignment has not yet been calibrated. The operation S1 may be automated, or may be performed semi-manually by a human operator using a handheld controller 34 connected with the robot controller 30. For example, in one nonlimiting example the handheld controller can have buttons that can be pressed to move the robot 3 in the +x-direction, or in the −x direction, or in the orthogonal +y-direction, or in the −y-direction, or various combinations thereof. In an operation S2, the robot is operated to lower the wafer carrier downward to close proximity to the load port 5. This again may be an automated operation or may be done semi-manually by a human operator using the handheld controller 34, e.g. by pressing a button to move the robot downward.

The operation S2 should lower the wafer carrier or pod 4 to a position close enough to the load port 5 for a human operator to perform an operation S3 in which the operator visually observes the lateral alignment (or, at this stage, more likely lateral misalignment) of the holes 20 in the bottom 14 of the pod body 12 and the alignment pins 22 of the load port 5. However, it will be appreciated that this visual observation S3 can be challenging, and may involve a trade-off with respect to how closely the operation S2 places the bottom 14 of the pod body 12 to the load port 5. If the bottom 14 of the pod body 12 is too far away from the load port 5, then the operator will have difficulty visually assessing the lateral misalignment due to the large distance between the holes 20 and alignment pins 22. On the other hand, if the bottom 14 of the pod body 12 is too close to the load port 5, then the wafer carrier or pod 4 may partially or wholly block the view of the observer, so that the holes 20 and/or alignment pins 22 may be unobservable. Hence, although not shown in FIG. 3, the operator may iterate operations S2 and S3 multiple times to obtain a good relative positioning of the bottom 14 of the pod body 12 to the load port 5 to best perform the visual observation of the misalignment in operation S3. Nonetheless, it will be appreciated that the visual assessment of the lateral (mis-)alignment in operation S3 is difficult and prone to some human error.

In an operation S4 (and assuming some lateral misalignment was observed in operation S3), the human operator uses the handheld controller 34 to operate the robot 3 to reduce the lateral misalignment between the holes 20 in the bottom 14 of the pod body 12 and the alignment pins 22 of the load port 5. This is done based on the visual observation of the misalignment in operation S3. In a decision S5 the operator decides whether the lateral alignment after adjustment in operation S4 is satisfactory. If it is not, then flow passes back to operation S3 where the operator re-assesses the misalignment after the adjustment, and again operates the robot 3 using the handheld controller 34 to reduce the observed lateral misalignment per operation S4 and again decides S5 as to whether the lateral alignment is now satisfactory. The operations S3, S4, and S5 may be iterated multiple times before the human operator is satisfied at operation S5. Additionally, at some point in this semi-manual process, the operator may choose to go back to operation S2 to adjust the separation between the bottom 14 of the pod body 12 and the load port 5 to improve visibility of the lateral misalignment. Furthermore, to assist in making the decision S5 as to whether the lateral alignment is satisfactory, the human operator may operate the handheld controller 34 to lower the wafer carrier or pod 4 all the way down into the load port 5 to confirm the correct lateral alignment by visually observing the wafer carrier or pod 4 properly seating into the load port 5.

When the operator is satisfied at decision S5 that the lateral alignment is satisfactory, in an operation S6 the lateral alignment is stored in the robot configuration memory 32. This may be done in various ways, such as by the operator pressing a button on the handheld controller 34 to store the current lateral position of the robot 3 as the lateral alignment of the robot with the load port.

It will be appreciated that details of the nonlimiting illustrative calibration process set forth above may vary. For example, the handheld controller 34 may be replaced by buttons on the housing of the transfer tool 1, or may be replaced by cellphone running a manual robot controller application program ("app"), or so forth. Notwithstanding such details, the calibration process is a manual procedure including the operation S3 in which the human operator visually assesses the lateral misalignment and then adjusts the position based on this observed misalignment in an iterative fashion. This is prone to human error, as the human operator must mentally deal with the vertical spatial separation between the holes 20 in the bottom 14 of the pod body 12 and the alignment pins 22 of the load port 5. This separation cannot be reduced too far by the operation S2 because at some point the bottom 14 of the pod body 12 begins entering into the load port 5 and becomes occluded from view by the load port 5. Hence, the calibration process of FIG. 3, or variants thereof using different handheld controller devices or so forth, is tedious and difficult.

Moreover, the calibration process of FIG. 3 is for a single load port 5. As previously noted, the transfer tool 1 may be only one portion of an overall overhead hoist transport (OHT) system, which may include many such transfer tools, one for each bench tool used in the semiconductor device fabrication process. The calibration process of FIG. 3 is repeated for each load port on the OHT system, and is repeated any time a bench tool is moved or otherwise modified in a way that calls for recalibration. In this regard, it should be noted that there may be multiple instances of the wafer carrier or pod 4 available for transporting wafer cassettes 10 through the semiconductor device fabrication process line, to maximize throughput. For example, if the process line is performed by an ordered sequence of: bench tool #1, bench tool #2, bench tool #3, bench tool #4, bench tool #5, . . . , then one wafer carrier or pod 4 may be carrying a cassette of wafers to bench tool #1 while another wafer carrier or pod 4 may be carrying a cassette from bench tool #3 to bench tool #4, and so forth, with the semiconductor wafers of the various cassettes being at different stages of the process line. The multiple instances of the wafer carrier or pod 4 are expected to be fungible, that is, the dimensions of the pod body 12 and its bottom 14 of the various instances should be identical or sufficiently similar so that the lateral alignment calibration of FIG. 3 performed using one instance of the wafer carrier or pod 4 will also work to laterally align any other instance of the wafer carrier or pod 4.

As a further difficulty, because the calibration is visually assessed by a human operator, the stored lateral alignment is prone to human error. If this error is large enough then it could potentially lead to problems such as a wafer carrier or pod becoming jammed in the load port, or misplaced in the load port in a way that may lead to damage to the cassette of semiconductor wafers or to individual semiconductor wafers retrieved from the cassette.

Some of the foregoing difficulties could potentially be remediated by automating the calibration process, for example by using a machine vision system integrated into the load port to automatically align the wafer carrier or pod as it is lowered by the robot into the load port. However, such modifications would be expensive. Additionally, some semiconductor device fabrications facilities may include bench tools purchased or leased from different vendors, only some of which vendors may provide such automation of the calibration process.

Figure 4:
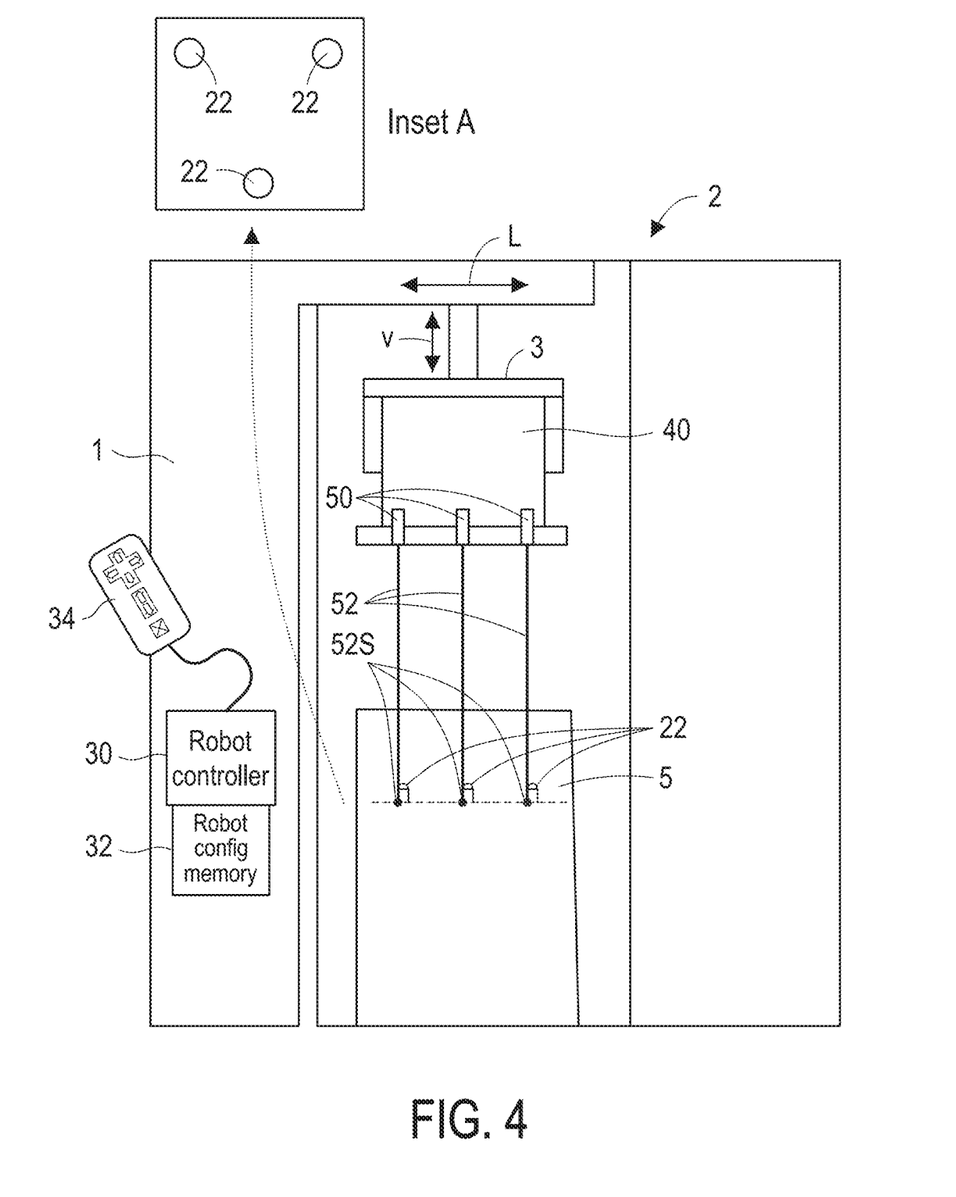
FIG. 4 diagrammatically illustrates the robotic wafer handling system or portion thereof arranged for calibration of the robot using a calibration pod.
Figure 5:
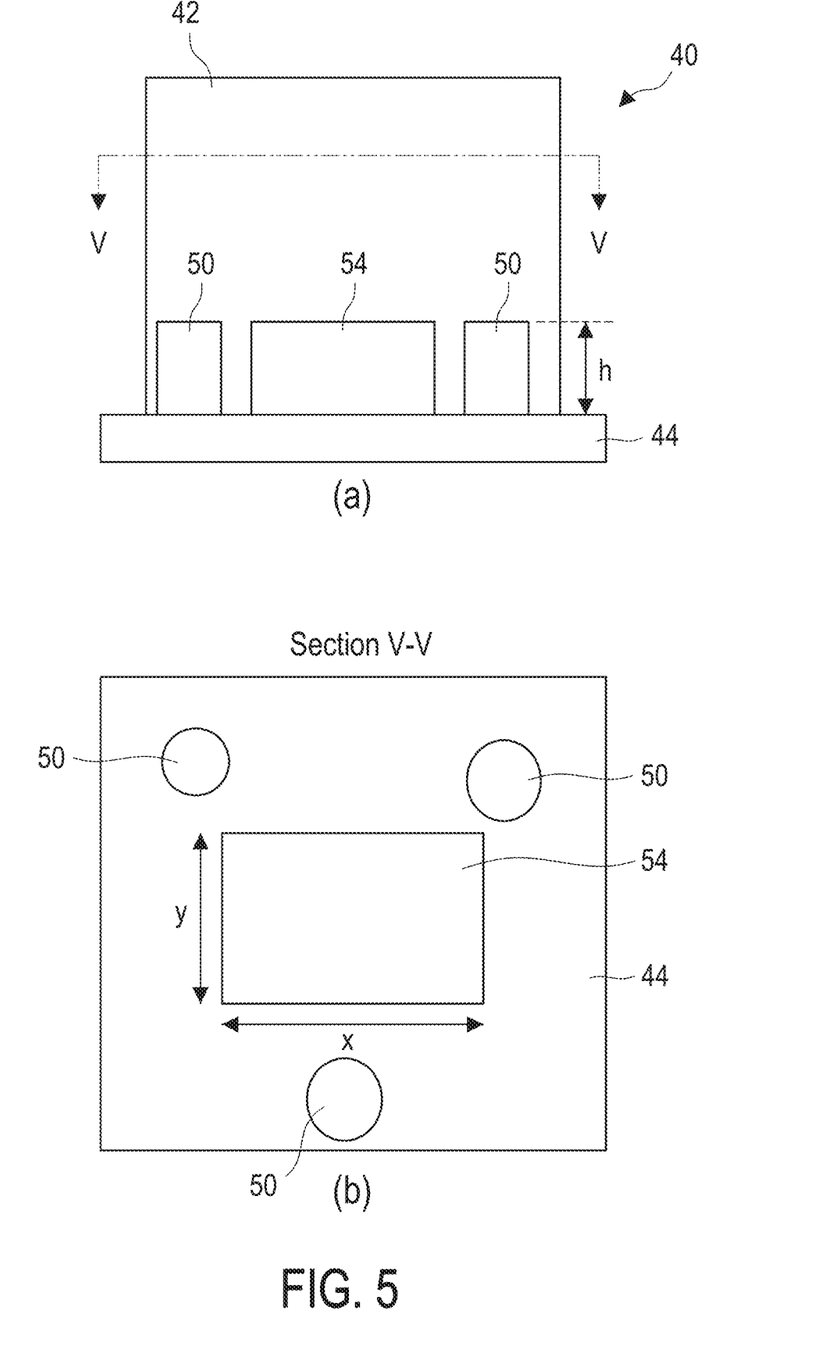
FIG. 5 diagrammatically illustrates (a) the calibration pod of FIG. 4 shown in diagrammatic side view, and (b) its bottom viewed along the view V-V indicated in part (a).
Figure 6:
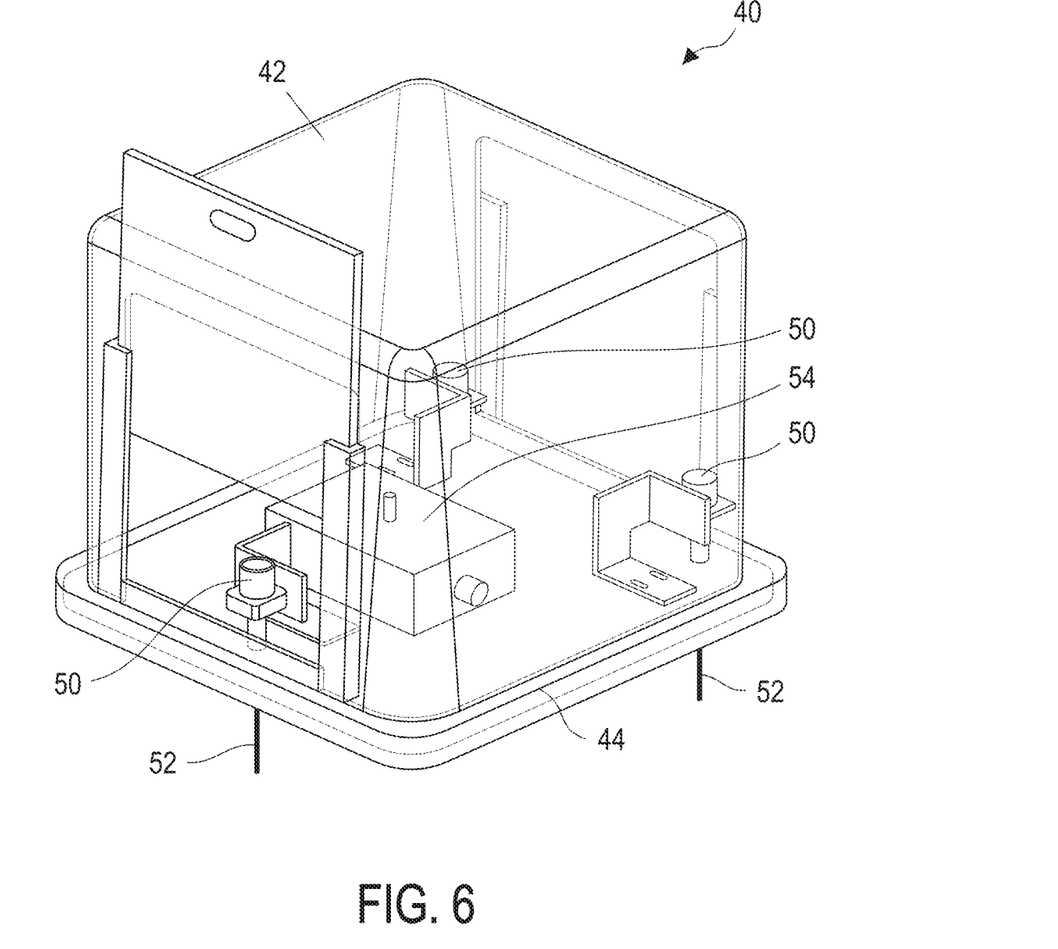
FIG. 6 diagrammatically illustrates a perspective view of the calibration pod of FIGS. 4 and 5.

With reference to FIGS. 4, 5, and 6, the foregoing difficulties are remediated as disclosed herein by way of providing a calibration pod 40 which assists in the calibration of the robot 3, along with a method for using the calibration pod 40 for the lateral alignment calibration, as described hereinafter with reference to FIG. 8. FIG. 4 shows the calibration pod 40 in the context of the transfer tool 1 for transferring semiconductor wafers to the bench tool 2 as already described with reference to FIG. 1, with the transfer tool 1 again including the robot 3 and the bench tool 2 again including the load port 5 as already described with reference to FIG. 1. The calibration pod 40 is shown in diagrammatic side view in FIG. 5(a), with FIG. 5(b) diagrammatically showing the section V-V indicated in FIG. 5(a). FIG. 6 diagrammatically shows a perspective view of the calibration pod 40.

The calibration pod 40 includes a pod body 42 with a bottom 44. In some embodiments, the pod body 42 is identical with the pod body 12 of the wafer carrier or pod 4 used for transporting a cassette 10 of semiconductor wafers. Indeed, in some embodiments the calibration pod 40 is manufactured by modifying an instance of the wafer carrier or pod 4 as described hereinafter with reference to FIG. 7. If the pod body 42 of the calibration pod 40 is not identical with the pod body 12 of the wafer carrier or pod 4, then the pod body 44 of the calibration pod 40 should have sufficient similarity to the pod body 12 of the wafer carrier or pod 4 so that it can be picked up and handled by the robot 3 in the same way as the wafer carrier or pod 4.

The calibration pod 40 further includes at least one laser 50, and in the illustrative embodiment three lasers 50, disposed on the bottom 44 of the pod body 42. As best seen in FIG. 4, the lasers 50 are positioned to emit laser beams 52 from the calibration pod 40. In some embodiments, the lasers 50 emit visible light, for example emit the laser beams 52 with a wavelength between 400 nm and 700 nm. By way of nonlimiting illustration, the lasers 50 emitting visible light may helium-neon (HeNe) lasers emitting red light or infrared (IR) diode laser modules that output IR-pumped, frequency doubled visible light in the green or blue or other wavelength range. Such lasers are sometimes used as laser pointers or laser pens. In some embodiments the lasers 50 are semiconductor diode lasers, optionally with optics for shaping a narrow-beamwidth laser beam. These are merely illustrative examples.

For the top-loading load port 5 shown in FIG. 4, the lasers 50 emit the laser beams 52 downward from the calibration pod 40 onto the load port 5 when the calibration pod 40 is held by the robot 3 in a position above the load port 5. To enable the calibration pod 40 to be self-operating, a power module 54 is suitably disposed in or on the calibration pod 40. In the illustrative embodiment, the power module 54 is disposed inside the pod body 42 and is mounted to the bottom 44 of the pod body 42, which provides enclosure for the power module 54 which outputs a significant amount of electrical power. As shown in FIG. 5, the dimensions x-y of the power module 54 should be small enough so it fits in the space on the bottom 44 surrounded by the lasers 50. However, this is merely an illustrative example and more generally the power module 54 may be mounted anywhere inside the pod body 42, or may be mounted on the outside of the pod body 42 so long as its exterior mounting does not interfere with the ability of the robot 3 to pick up and handle the calibration pod 40. The power module 54 may include a sealed battery, or may include a battery receptacle for receiving a replaceable battery, to provide electrical power for driving the lasers 50. The power module 54 may additionally include power conditioning electronics for conditioning the electrical power from the battery to drive the lasers 50, and for splitting the conditioned electrical power to the lasers 50 in embodiments in which there are two or more lasers 50 (e.g. three lasers 50 in the illustrative example). Additionally, electrical wiring (not shown) operatively connects the lasers 50 to receive the conditioned power from the power module 54. In a variant embodiment, some or all of the power conditioning circuitry may be incorporated into the lasers 50—in this variant embodiment each laser 50 is a laser package that includes integral power conditioning electronics. It will be appreciated that a maximum height h indicated in FIG. 5(a) for the lasers 50 and power module 54 should be small enough for these components to fit inside the pod body 42.

The lasers 50 are arranged on the bottom 44 of the calibration pod 40 in the same the same lateral pattern as the alignment pins 22 of the load port 5 (see Inset A diagrammatically showing the view into the load port 5 of FIG. 4, which is identical with Inset A of FIG. 1). If the calibration pod 40 is manufactured by modifying an instance of the wafer carrier or pod 4, then this is readily achieved by installing the lasers 50 into the holes 20 of the bottom 14 of the pod body 12 of the thusly modified instance of the wafer carrier or pod 4—as the holes 20 of the bottom 14 of the pod body 12 of the wafer carrier or pod 4 have the same lateral alignment as the alignment pins of the load port 5, it follows that the lasers 50 installed in those holes 20 will also have the same lateral alignment as the alignment pins 22 of the load port 5. Furthermore, in some embodiments the lasers 50 are oriented to emit the laser beams 52 straight downward. In this case, the calibration pod 40 carried by the robot 3 is in lateral alignment with the load port 5 when the laser beams 52 impinge on respective alignment pins 22 of the load port 5.

Figure 7:
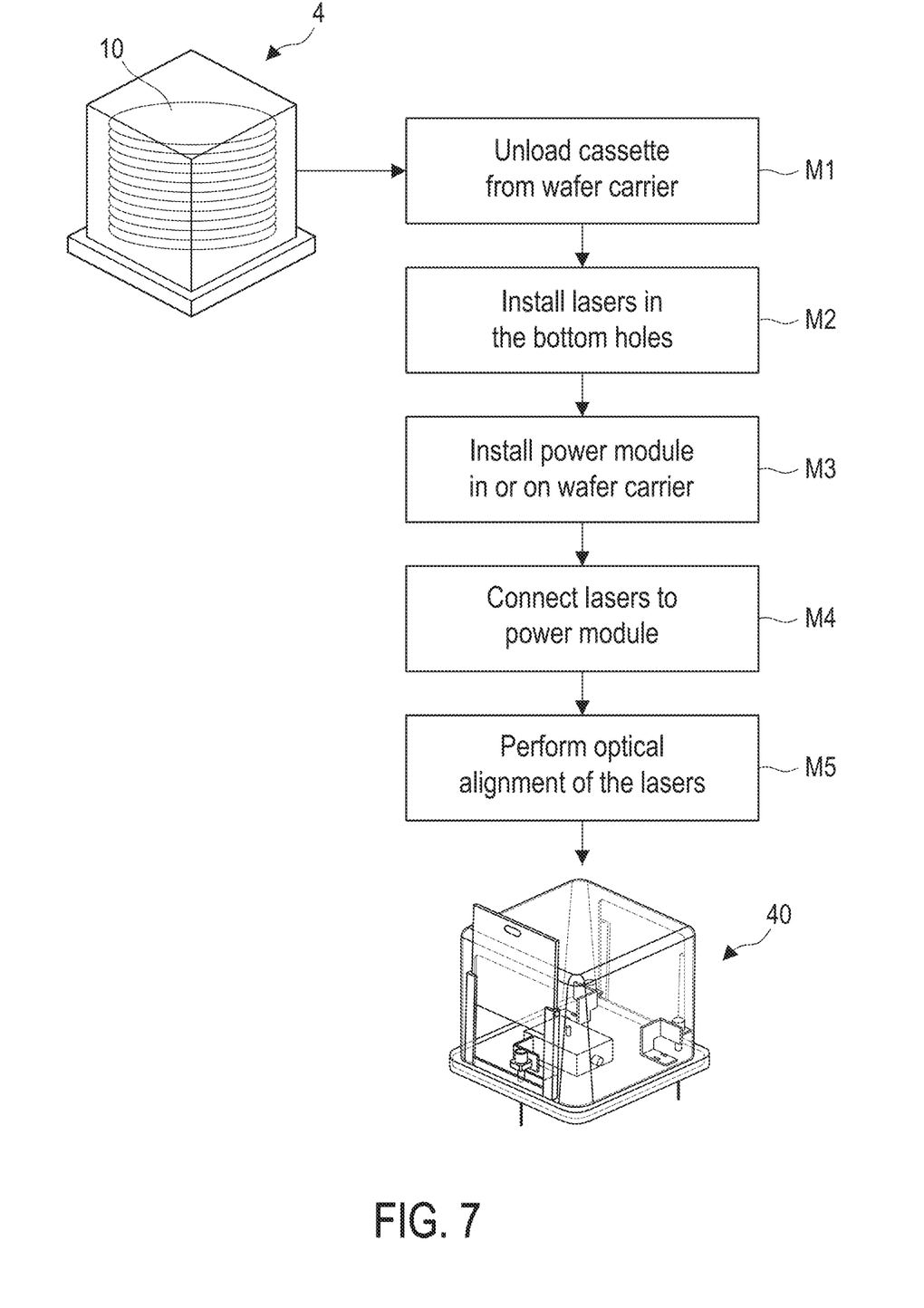
FIG. 7 shows a flowchart for fabricating the calibration pod of FIGS. 4-6.

With reference to FIG. 7, a suitable method for modifying an instance of the wafer carrier or pod 4 to manufacture the calibration pod 40 is described. In an operation M1, the cassette 10 is unloaded from the wafer carrier or pod 4. (If the instance of the wafer carrier or pod 4 is already unloaded then the operation M1 is suitably omitted). In an operation M2, the lasers 50 are installed in the holes 20 of the bottom 14 of the wafer carrier or pod 4. This can be done using any mounting hardware suitable for the particular lasers 50 and the diameter of the holes 20 and the structural nature of the bottom 14 (e.g., whether the bottom 14 is metal, plastic, or so forth). In an operation M3, the power module 54 is installed in or on the wafer carrier or pod 4. This can be done using mounting hardware suitable for securing the housing of the power module 54 and suitable for the structural nature of the bottom 14 (e.g., whether the bottom 14 is metal, plastic, or so forth). In an operation M4, the lasers 50 are electrically connected with the power module 54 to receive electrical power from the power module 54. Depending on the design, the operation M4 may, for example, include soldering connecting wires, or attaching power cables using connectors incorporated into the cables, or so forth. Where there are multiple lasers 50 to connect (e.g. illustrative three lasers 50), the operation M4 may also include providing a power splitter to split the power from the power module 54 to the lasers 50 (e.g. for the illustrative three lasers 50 a three-way power splitter may be suitably used).

Finally, in an optional operation M5, optical alignment of the lasers 50 is performed. In some embodiments the operation M5 may be omitted—for example, if the pod body of the wafer carrier or pod 4 is designed so that the plane of its bottom 14 is precisely parallel with the floor when the wafer carrier or pod 4 is carried by the robot 3, and the mounting hardware for mounting the lasers 50 in the holes 20 of the bottom 14 orient the lasers with the beams 52 orthogonal to the plane of the bottom 14, and the lasers 50 themselves are commercial pre-aligned units, then the operation M5 may be omitted. However, if one or more of these conditions are not met, then the lasers 50 may be optically aligned using alignment screws or other alignment features built into most commercial lasers. The alignment M5 is performed to ensure the laser beams 52 point straight downward (i.e., parallel with the gravitational force vector, or perpendicular to the plane of the floor if the floor is level) when the wafer carrier or pod 4 is carried by the robot 3. This alignment can use various approaches. In one approach, if the robot 3 is capable of rotating the wafer carrier or pod 4 about its axis Av (see FIG. 1), then the lasers may be properly optically aligned when the laser beam does not trace a circle on the floor or other level surface as the robot rotates the wafer carrier or pod 4 around the axis Av. Other approaches can be used for the optical alignment operation M5, such as using a simple plumb line to define "straight down". The result of the manufacturing process of FIG. 7 is the calibration pod 40 ready for use in calibrating the lateral alignment of the robot 3 respective to the load port 5.

Figure 8:
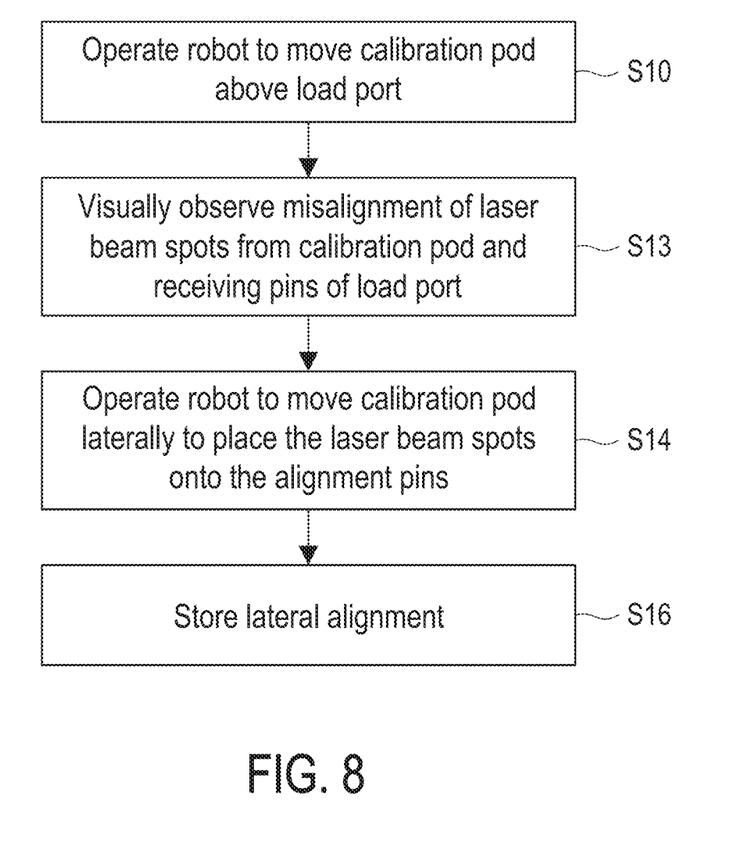
FIG. 8 shows a flowchart for calibrating the robotic wafer handling system of FIG. 4 using the calibration pod of FIGS. 4-6.

With reference to FIG. 8, a lateral alignment calibration method using the calibration pod 40 is described. This lateral calibration method is usefully compared with the lateral calibration method of FIG. 3, which uses a wafer carrier or pod 4 without the modifications of FIG. 7, to illustrate the benefits of the lateral calibration method of FIG. 8 which employs the calibration pod 40. An operation S10 of the method of FIG. 8 corresponds to operation S1 of the method of claim 3, except that in the operation S10 of the method of FIG. 8 it is the calibration pod 40 (rather than the wafer carrier or pod 4 as in the method of FIG. 3) that is picked up and moved above the load port 5. The method of FIG. 8 does not include an operation corresponding to operation S2 of the method of FIG. 3 in which the robot lowers the wafer carrier downward into proximity with the load port. This is because the lasers 50 provide alignment laser beams 52 which point directly downward, eliminating the need for the human operator to attempt to visually assess alignment of features (i.e. holes 20) at the wafer carrier with the alignment pins 22 of the load port 5. In a variant approach, the method of FIG. 8 may include an operation (not shown) which is analogous to operation S2, but which only lowers the calibration pod 40 partway but not into proximity to the load port 5. In either case, because the calibration pod 40 is not in proximity to the load port 5, the human operator has a good view into the load port 5 which is not obstructed by the calibration pod 40.

In an operation S13, the operator visually observes laser beam spots 52S (see FIG. 4) produced on the load port 5 by impingement of the laser beams 52 onto the load port 5. This operation is somewhat analogous to the operation S3 of the method of FIG. 3. However, in the operation S13 it is much easier for the human operator to observe lateral misalignment of the robot 3 and the load port 5, because the laser beam spots 52S are on the load port 5 together with the targeted alignment pins 22. Because the laser beams 52 are directed directly downward and the sourcing lasers 50 are disposed in the same openings 20 that are to be aligned with the alignment pins 22 of the load port 5, it follows that if the robot 3 is correctly laterally aligned with the load port 5 then the laser beam spots 52S will be produced on the alignment pins 22. Any offset between the laser beam spots 52S and the alignment pins 22 of the load port 5 are therefore due to the lateral misalignment. For example, FIG. 4 shows the laser beam spots 52S offset slightly to the left of the alignment pins 22, indicating a slight lateral misalignment.

Moreover, the human operator is assisted in performing the lateral misalignment observation of operation S13 because in the method of FIG. 8 the calibration pod 40 can be positioned at a higher elevation than is the wafer carrier 4 in the method of FIG. 3 so as to not occlude the view into the load port 5—by contrast, in the method of FIG. 3 the wafer carrier 4 is in close proximity to the load port 5 to enable visual comparison of the lateral positions of the holes 20 and alignment pins 22, and can therefore occlude the view into the load port 5.

With continuing reference to FIG. 8, in an operation S14 the human operator uses the handheld controller 34 to operate the robot 3 to move the calibration pod 40 laterally until the laser beam spots 52S coincide with the alignment pins 22 of the load port 5. This operation is somewhat analogous to the operation S4 of the method of FIG. 3. However, in the method of FIG. 8 which uses the calibration pod 40, the human operator can see both the alignment pins 22 and the laser beam spots 52S simultaneously by looking into the load port 5. Because of this, there is no need for the iterative adjustment of the alignment method of FIG. 3. Rather, the human operator can directly visually observe in real time the movement of the laser beam spots 52S relative to the alignment pins 22 by looking into the load port 5, and can place the laser beam spots 52S onto the alignment pins 22 easily. For the example of FIG. 4, this would entail the human operator moving the robot 3 laterally to the right slightly to bring the laser beam spots 52S onto the alignment pins 22. (This assumes no misalignment in the orthogonal lateral direction "into or out of the page" in FIG. 4—if there is misalignment in this orthogonal lateral direction the human operator can readily observe it as an offset of the laser beam spots 52S respective to the alignment pins 22 in that orthogonal direction and can similarly correct the lateral misalignment in the orthogonal lateral direction). When the laser beam spots 52S coincide with the alignment pins 22, the robot 3 is laterally aligned with the load port 5, and in an operation S16 this lateral alignment of the robot 3 with the load port 5 is stored in the robot configuration memory 32 analogously to the operation S6 of the method of FIG. 3.

The lateral alignment calibration method of FIG. 8 has further advantages in the case of an overhead hoist transport (OHT) system with multiple transfer tools for multiple bench tools. In this case, there is no modification to any of the load ports, and the robot 3 can be transported via the OHT from one load port to another and used to calibrate lateral alignment of the robot 3 for each load port on the OHT system. This makes lateral alignment calibration of multiple load ports fast, and the additional cost is low as a single calibration pod 40 can be used for lateral alignment calibration of the multiple load port.

In the foregoing examples, the lasers 50 emit visible light, e.g. the lasers 50 emit the laser beams 52 with a wavelength between 400 nm and 700 nm. In this case, the human operator can visually see the laser beam spots 52S on the load port 5, and the lateral alignment method of FIG. 8 is performed semi-manually, e.g. by manual operation of the handheld controller 34 to move the laser beam spots 52S. Furthermore, in the foregoing examples the lasers 50 are mounted in the same holes 20 into which the alignment pins 22 are to engage when the wafer carrier 4 is loaded into the load port 5 by the robot 3. In this arrangement, the proper lateral alignment between the robot 3 and the load port 5 is achieved when the laser beam spots 52S align with the alignment pins 22. Hence, the alignment pins 22 serve as features of the load port with which the laser beams 52 are to be aligned.

In some cases, it may be undesirable to use the alignment pins 22 as the features of the load port 5 with which the laser beams 52 are aligned to determine the proper lateral alignment. As one situation where this may be the case, if the alignment pins 22 are pointed and/or made of a highly reflective metal, it may be difficult for the human operator to see the laser beam spots 52S when they are directly on the alignment pins 22, due to light scattering from the highly reflective pointed pins 22. If the laser beams 52 are bright, this may even be visually uncomfortable for the human operator. (Preferably, the lasers 50 are of sufficiently low optical output power to be unable to produce eye damage. For example, the lasers 50 may be Class 1 lasers, or Class 2 lasers that emit visible light below 1 milliwatt).

Figure 9:
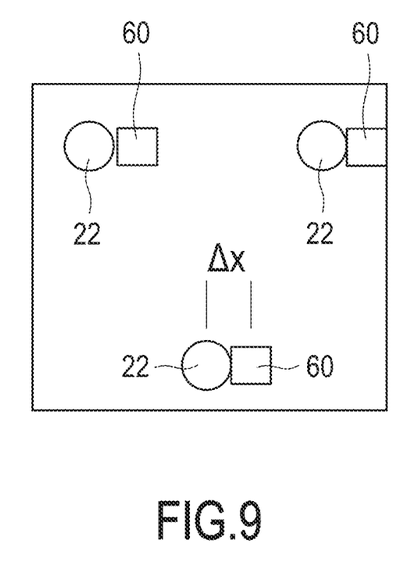
FIG. 9 illustrates a variant of Inset A of FIGS. 1 and 4 which includes optical detectors.

With reference to FIG. 9, in a variant embodiment dedicated alignment features 60 are disposed on the load port 5. FIG. 9 shows the view into the load port 5 (analogous to Inset A of FIGS. 1 and 4). FIG. 9 depicts the alignment pins 22 in their lateral pattern, along with the dedicated alignment features 60. The dedicated alignment features 60 have the same lateral pattern as the alignment pins 22, but with a lateral offset relative to the alignment pins indicated as $\Delta x$ in FIG. 9. The alignment features 60 can for example be stickers, engravings into or bosses on a flat surface of the load port 5, or some other type of visibly perceptible mark. In this variant embodiment, the method of FIG. 8 is performed as already described, except for two changes. First, in the operation S14, the human operator is instructed to operate the robot 3 to move the calibration pod 40 to place the laser beam spots 52S onto the dedicated alignment features 60, rather than onto the alignment pins 22. Second, in the operation S16 the stored lateral alignment is corrected for the offset $\Delta x$ between the dedicated alignment features 60 and the alignment pins 22. In the illustrative example of FIG. 9, since the alignment features 60 are to the right of the alignment pins 22 by the offset distance $\Delta x$ it follows that the correct lateral alignment of the robot 3 and the load port 5 for storage is obtained by subtracting the offset distance $\Delta x$ from the x-coordinate of the robot 3 when the laser beam spots 52S coincide with the features 60. It should be noted that the offset may have components in both x- and y-coordinate directions, in which case similar correction is performed for the y-coordinate.

With continuing reference to FIG. 9, in another contemplated embodiment, the dedicated alignment features 60 may be optical detectors 60 having the same lateral pattern as the lateral pattern of the plurality of lasers 50. Here, the robot 3 is laterally aligned with the load port 5 when the laser beams 52 of the plurality of lasers 50 are detected by respective optical detectors 60 of the plurality of optical detectors. In this case the lateral alignment of the robot 3 and the load port 5 can be determined by operating the robot to run a lateral raster pattern until the optical detectors 60 detect the laser beams whereby the lateral alignment is determined. Again, the stored lateral alignment is suitably corrected for the offset Δx. Advantageously, this alignment can be done in a more automated fashion compared with the method of FIG. 8, as the manual operation S14 of the method of FIG. 8 is replaced by automated lateral rastering (i.e., two-dimensional lateral scanning) of the robot 3. For automation, the outputs of the optical detectors 60 are suitably fed into the robot controller 30 so it can detect when the laser beam spots 52S are detected. Since in this embodiment the optical detectors 60 detect the laser beams 52, rather than the laser beams being visually detected, it is contemplated for this embodiment to use lasers that emit light outside of the visible range, e.g. the laser beams 52 may be at a wavelength below 400 nm or above 700 nm.

In any of the foregoing embodiments and with reference back to FIG. 1, after calibrating the robot 3, the robot 3 may be then used to load a wafer carrier or pod 4 into the load port 5 by picking up the wafer carrier or pod 4 using the robot 3, retrieving the lateral alignment from the robot configuration memory 32, and moving the robot 3 to the lateral alignment retrieved from the robot configuration memory 32. With the wafer carrier or pod 4 thusly laterally aligned, the robot 3 can then move downward in the vertical motion V to place the wafer carrier or pod 4 into the load port 5, with the wafer carrier or pod 4 laterally aligned so that the alignment pins 22 of the load port 5 mate into the holes 20 of the bottom 14 of the pod body 12 of the wafer carrier or pod 4. The semiconductor wafers in the cassette 10 can then be transferred to the bench tool 2.

In the following, some further embodiments are described.

In a nonlimiting illustrative embodiment, a calibration pod is disclosed for calibrating a robotic wafer pod handling apparatus. The calibration the pod includes a pod body configured for handling by the robotic pod handling apparatus, at least one laser disposed on a bottom of the pod body, and a power module disposed on or in the pod body and operatively connected to power the at least one laser.

In a nonlimiting illustrative embodiment, a calibration pod is disclosed for calibrating a robotic wafer pod handling apparatus. The calibration the pod includes a pod body configured for handling by the robotic pod handling apparatus, at least one laser disposed on a bottom of the pod body, and a power module disposed on or in the pod body and operatively connected to power the at least one laser. The pod body comprises a wafer carrier configured to carry a cassette of semiconductor wafers, the wafer carrier having a bottom with a plurality of holes for aligning placement of the wafer carrier in a load port of a semiconductor device fabrication facility, and the at least one laser comprises a plurality of lasers corresponding to the plurality of holes in the bottom of the wafer carrier and each laser is mounted in a respective hole of the bottom of the wafer carrier.

In a nonlimiting illustrative embodiment, a robotic wafer handling apparatus includes a load port of a semiconductor device fabrication facility, a robot configured to load an associated wafer carrier in the load port, and a calibration pod. The load port has a plurality of alignment pins having a lateral pattern. The associated wafer carrier is configured to carry a cassette of semiconductor wafers, and has a bottom with a plurality of holes with the same lateral pattern as the alignment pins of the load port. The calibration pod is configured for handling by the robot and includes a pod body with a bottom and a plurality of lasers disposed on the bottom of the pod body and emitting laser beams from the calibration pod.

In a nonlimiting illustrative embodiment, a robotic wafer handling apparatus includes a load port of a semiconductor device fabrication facility, a robot configured to load an associated wafer carrier in the load port, and a calibration pod. The load port has a plurality of alignment pins having a lateral pattern. The associated wafer carrier is configured to carry a cassette of semiconductor wafers, and has a bottom with a plurality of holes with the same lateral pattern as the alignment pins of the load port. The calibration pod is configured for handling by the robot and includes a pod body with a bottom and a plurality of lasers disposed on the bottom of the pod body and emitting laser beams from the calibration pod. The lasers are disposed on the bottom of the pod body in the same lateral pattern as the alignment pins of the load port. The robot is laterally aligned with the load port when the laser beams are aligned with the alignment pins of the load port. The robotic wafer handling apparatus further includes a robot configuration memory for storing the lateral alignment of the robot with the load port.

In a nonlimiting illustrative embodiment, a method is disclosed of calibrating a robot configured to load a wafer carrier in a load port of a semiconductor device fabrication facility. In the method, the robot is operated to move a calibration pod above the load port such that a plurality of lasers of the calibration pod output laser beams downward from the calibration pod onto the load port. A lateral alignment of the robot respective to the load port is determined by operating the robot to adjust a lateral position of the calibration pod to align the laser beams with corresponding features of the load port. The determined lateral alignment is stored in a robot configuration memory.

In a nonlimiting illustrative embodiment, a method is disclosed of calibrating a robot configured to load a wafer carrier in a load port of a semiconductor device fabrication facility. In the method, the robot is operated to move a calibration pod above the load port such that a plurality of lasers of the calibration pod output laser beams downward from the calibration pod onto the load port. A lateral alignment of the robot respective to the load port is determined by operating the robot to adjust a lateral position of the calibration pod to align the laser beams having a wavelength between 400 nm and 700 nm with corresponding features of the load port. The determined lateral alignment is stored in a robot configuration memory. In some embodiments, the corresponding features of the load port with which the laser beams are aligned comprise wafer carrier alignment pins of the load port.

In a nonlimiting illustrative embodiment, a method of loading a wafer carrier into a load port of a semiconductor device fabrication facility is disclosed. A robot is calibrated respective to the load port by performing a method including: operating the robot to move a calibration pod above the load port such that a plurality of lasers of the calibration pod output laser beams downward from the calibration pod onto the load port; determining a lateral alignment of the robot respective to the load port by operating the robot to adjust a lateral position of the calibration pod to align the laser beams with corresponding features of the load port; and storing the determined lateral alignment in a robot configuration memory. After calibrating the robot, the robot is used to load the wafer carrier into the load port including picking up the wafer carrier using the robot, retrieving the lateral alignment from the robot configuration memory, and moving the robot to the lateral alignment retrieved from the robot configuration memory.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A robotic wafer handling apparatus comprising:
   a calibration pod for calibrating the robotic wafer handling apparatus, the calibration pod comprising: a pod body configured for handling by the robotic pod handling apparatus, at least three lasers disposed on a bottom of the pod body, and a power module disposed on or in the pod body and operatively connected to power the at least three lasers;
   a load port of a semiconductor device fabrication facility, the load port having a plurality of alignment pins having a lateral pattern and further having a plurality of alignment features with the same lateral pattern as the plurality of alignment pins, wherein the lateral pattern of the plurality of alignment features has a lateral offset relative to the lateral pattern of the plurality of alignment pins of the load port; and
   a robot configured to load an associated wafer carrier in the load port, the associated wafer carrier being configured to carry a cassette of semiconductor wafers and having a bottom with a plurality of holes with the same lateral pattern as the plurality of alignment pins of the load port such that the alignment pins of the load port mate into the holes of the bottom of the associated wafer carrier when the associated wafer carrier is loaded in the load port;
   wherein the robot is laterally misaligned with the load port by the lateral offset of the lateral pattern of the plurality of alignment features of the load port relative to the lateral pattern of the plurality of alignment pins of the load port when the laser beams disposed on the bottom of the pod body of the calibration pod are aligned with the alignment features of the load port.

2. The robotic wafer handling apparatus of claim 1 wherein:
   the pod body comprises a wafer carrier configured to carry a cassette of semiconductor wafers, the wafer carrier having a bottom with at least three holes for aligning placement of the wafer carrier in a load port of a semiconductor device fabrication facility, and the at least three lasers correspond to the at least three holes in the bottom of the wafer carrier and each laser is mounted in a respective hole of the bottom of the wafer carrier.

3. The robotic wafer handling apparatus of claim 2 wherein the lasers of the at least three lasers are oriented to output light from the bottom of the pod body toward the load port when the calibration pod is above the load port, and the at least three lasers are oriented to provide lateral alignment with respect to each of two orthogonal translation directions of the calibration pod and a rotation of the calibration pod.

4. The robotic wafer handling apparatus of claim 2 wherein the power module is disposed on the bottom of the pod body.

5. The robotic wafer handling apparatus of claim 2 wherein the lasers of the at least three lasers emit visible light.

6. The robotic wafer handling apparatus of claim 1 wherein the calibration pod is manufactured by modifying a wafer carrier configured to carry a cassette of semiconductor wafers and configured for handling by the robotic pod handling apparatus, the modifying including:
   installing the lasers in holes in a bottom of the wafer carrier;
   mounting the power module on the bottom of the wafer carrier; and
   connecting the lasers to the power module.

7. A robotic wafer handling apparatus comprising:
   a load port of a semiconductor device fabrication facility, the load port having a plurality of alignment pins having a lateral pattern;
   a robot configured to load an associated wafer carrier in the load port, the associated wafer carrier being configured to carry a cassette of semiconductor wafers and having a bottom with a plurality of holes with the same lateral pattern as the alignment pins of the load port; and
   a calibration pod configured for handling by the robot and including a pod body with a bottom and a plurality of lasers disposed on the bottom of the pod body in the same lateral pattern as the alignment pins of the load port and emitting laser beams from the calibration pod;
   wherein the load port includes a plurality of optical detectors having the same lateral pattern as the lateral pattern of the plurality of lasers wherein the lateral pattern of the plurality of lasers is offset from the lateral pattern of the plurality of alignment pins by an offset $\Delta x$; and
   wherein the robot is laterally aligned with the load port when the laser beams are aligned with the alignment pins of the load port and the robot is laterally misaligned with the load port by the offset $\Delta x$ when the laser beams of the plurality of lasers are detected by respective optical detectors of the plurality of optical detectors.

8. The robotic wafer handling apparatus of claim 7 further comprising:
   a robot configuration memory for storing the lateral alignment of the robot with the load port.

9. The robotic wafer handling apparatus of claim 8 wherein the calibration pod comprises an instance of the associated wafer carrier modified by mounting the lasers of the plurality of lasers in respective holes of the plurality of holes in the bottom of the instance of the associated wafer carrier.

10. The robotic wafer handling apparatus of claim 9 wherein the instance of the associated wafer carrier is further modified by disposing a power module on or in the instance of the associated wafer carrier and connecting the power module to power the lasers of the plurality of lasers.

11. The robotic wafer handling apparatus of claim 7 wherein the calibration pod is shaped and sized the same as the associated wafer carrier.

12. The robotic wafer handling apparatus of claim 7 wherein the lasers of the plurality of lasers emit laser beams with a wavelength between 400 nm and 700 nm.

13. The robotic wafer handling apparatus of claim 7 wherein the robot is configured to run a lateral raster pattern until the optical detectors detect the laser beams whereby the lateral alignment is determined.

14. A method of calibrating a robot configured to load a wafer carrier in a load port of a semiconductor device fabrication facility including mating alignment pins of the load port into corresponding holes of the bottom of the wafer carrier, the method comprising:
operating the robot to move a calibration pod above the load port such that a plurality of lasers of the calibration pod output laser beams downward from the calibration pod onto the load port;
determining a lateral alignment of the robot respective to the load port by operating the robot to adjust a lateral position of the calibration pod to align the laser beams with corresponding alignment features of the load port, wherein the alignment features have a same lateral pattern as the alignment pins of the load port but the lateral pattern of the alignment features has a lateral offset relative to the lateral pattern of the alignment pins; and
storing the determined lateral alignment in a robot configuration memory.

15. The method of claim 14 wherein the alignment features of the load port are stickers, engravings into or bosses on a flat surface of the load port.

16. The method of claim 15 wherein the laser beams have a wavelength between 400 nm and 700 nm.

17. The method of claim 14 further comprising:
constructing the calibration pod from a wafer carrier configured to be loaded in the load port by the robot, the constructing including inserting the lasers of the plurality of lasers into holes in a bottom of the wafer carrier.

18. The method of claim 17 wherein the constructing further includes installing a power module in or on the wafer carrier and connecting the power module to power the lasers of the plurality of lasers.

19. The method of claim 14 wherein the alignment features of the load port comprise optical detectors of the load port, and the determining of the lateral alignment of the robot includes:
operating the robot to run a lateral raster pattern until the optical detectors detect the laser beams whereby the lateral alignment is determined.

20. The method of claim 14 further comprising:
after calibrating the robot, using the robot to load the wafer carrier into the load port including picking up the wafer carrier using the robot, retrieving the lateral alignment from the robot configuration memory, and moving the robot to the lateral alignment retrieved from the robot configuration memory.

* * * * *